(12) United States Patent
Dei et al.

(10) Patent No.: US 9,126,231 B2
(45) Date of Patent: Sep. 8, 2015

(54) INSULATION PATTERN-FORMING METHOD AND INSULATION PATTERN-FORMING MATERIAL

(71) Applicant: JSR CORPORATION, Tokyo (JP)

(72) Inventors: Satoshi Dei, Tokyo (JP); Hayato Namai, Tokyo (JP); Kyoyu Yasuda, Tokyo (JP); Koichi Hasegawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/685,744

(22) Filed: Nov. 27, 2012

(65) Prior Publication Data

US 2013/0084394 A1    Apr. 4, 2013

Related U.S. Application Data

(63) Continuation of application No. PCT/JP2011/062136, filed on May 26, 2011.

(30) Foreign Application Priority Data

May 28, 2010    (JP) .................................. 2010-123392

(51) Int. Cl.
*G03F 7/00*    (2006.01)
*B05D 1/32*    (2006.01)
(Continued)

(52) U.S. Cl.
CPC .............. *B05D 1/322* (2013.01); *C09D 183/06* (2013.01); *G03F 7/0392* (2013.01); *G03F 7/094* (2013.01);
(Continued)

(58) Field of Classification Search
CPC ................................ B82Y 30/00; G03F 7/094

USPC ........ 427/256, 282; 216/41, 83; 430/312, 313
See application file for complete search history.

(56) References Cited

U.S. PATENT DOCUMENTS 5,753,967 A * 5/1998 Lin ............................... 257/635
5,843,624 A * 12/1998 Houlihan et al. ............. 430/296
(Continued)

FOREIGN PATENT DOCUMENTS

JP    07-122638    5/1995
JP    2000-077410    3/2000
(Continued)

OTHER PUBLICATIONS

International Search Report for corresponding International Application No. PCT/JP2011/062136, Aug. 16, 2011.
(Continued)

*Primary Examiner* — Cachet Sellman
(74) *Attorney, Agent, or Firm* — Oblon, McClelland, Maier & Neustadt, L.L.P.

(57) ABSTRACT

An insulation pattern-forming method includes forming an organic pattern on a substrate. A space defined by the organic pattern is filled with an insulating material. The organic pattern is removed to obtain an inverted pattern formed of the insulating material. The inverted pattern is cured. An insulation pattern-forming method includes forming a first organic pattern on the substrate. A space defined by the first organic pattern is filled with an insulating material. An upper surface of the first organic pattern is exposed. A second organic pattern that comes in contact with the upper surface of the first organic pattern is formed. A space defined by the second organic pattern is filled with the insulating material. The first organic pattern and the second organic pattern are removed to obtain an inverted pattern formed of the insulating material. The inverted pattern is cured.

12 Claims, 1 Drawing Sheet

(51) Int. Cl.
　　　*G03F 7/09*　　　(2006.01)
　　　*H01L 21/311*　　(2006.01)
　　　*H01L 21/033*　　(2006.01)
　　　*H01L 21/768*　　(2006.01)
　　　*C09D 183/06*　　(2006.01)
　　　*G03F 7/039*　　(2006.01)
　　　*G03F 7/38*　　 (2006.01)
　　　*G03F 7/40*　　 (2006.01)

(52) U.S. Cl.
　　　CPC　*G03F 7/38* (2013.01); *G03F 7/405* (2013.01); *H01L 21/0337* (2013.01); *H01L 21/311* (2013.01); *H01L 21/76801* (2013.01); *H01L 21/76802* (2013.01); *H01L 21/76807* (2013.01)

(56) References Cited

U.S. PATENT DOCUMENTS

| | | | |
|---|---|---|---|
| 6,303,524 B1 * | 10/2001 | Sharangpani et al. | 438/780 |
| 6,376,361 B1 * | 4/2002 | Chooi et al. | 438/631 |
| 2008/0196626 A1 * | 8/2008 | Wu et al. | 106/287.34 |
| 2010/0040838 A1 * | 2/2010 | Abdallah et al. | 428/195.1 |
| 2012/0122037 A1 * | 5/2012 | Bradford et al. | 430/325 |

FOREIGN PATENT DOCUMENTS

| | | | |
|---|---|---|---|
| JP | 2001-077194 | | 3/2001 |
| JP | 077194 | * | 3/2001 |
| JP | 2002-110510 | | 4/2002 |
| JP | 2002-299441 | | 10/2002 |
| JP | 2003-253204 | | 9/2003 |
| JP | 2005-139264 A | | 6/2005 |
| JP | 2007-149953 | | 6/2007 |
| JP | 2008-287176 | | 11/2008 |
| JP | 2010-060954 | | 3/2010 |
| WO | WO 2007/142209 | | 12/2007 |

OTHER PUBLICATIONS

Written Opinion for corresponding International Application No. PCT/JP2011/062136, Aug. 16, 2011.

Office Action received in JP 2010-123392, dated May 13, 2014 (w/English Translation).

Office Action issued on Mar. 31, 2015 in Japanese Patent Application No. 2014-142245 with English translation.

* cited by examiner

INSULATION PATTERN-FORMING METHOD AND INSULATION PATTERN-FORMING MATERIAL

CROSS-REFERENCE TO RELATED APPLICATIONS

The present application is a continuation application of International Application No. PCT/JP2011/062136, filed May 26, 2011, which claims priority to Japanese Patent Application No. 2010-123392, filed May 28, 2010. The contents of these applications are incorporated herein by reference in their entirety.

BACKGROUND OF THE INVENTION

1. Field of the Invention

The invention relates to an insulation pattern-forming method and an insulation pattern-forming material.

2. Discussion of the Background

When producing a semiconductor device or the like, a fine pattern is formed on an organic or inorganic substrate using a pattern transfer method that utilizes a lithographic technique, a resist development process, and an etching technique (see Japanese Patent Application Publication (KOKAI) No. 2002-110510, for example).

SUMMARY OF THE INVENTION

According to one aspect of the present invention, an insulation pattern-forming method includes forming an organic pattern on a substrate. A space defined by the organic pattern is filled with an insulating material. The organic pattern is removed to obtain an inverted pattern formed of the insulating material. The inverted pattern is cured.

According to another aspect of the present invention, an insulation pattern-forming method includes forming a first organic pattern on the substrate. A space defined by the first organic pattern is filled with an insulating material. An upper surface of the first organic pattern is exposed. A second organic pattern that comes in contact with the upper surface of the first organic pattern is formed. A space defined by the second organic pattern is filled with the insulating material. The first organic pattern and the second organic pattern are removed to obtain an inverted pattern formed of the insulating material. The inverted pattern is cured.

According to further aspect of the present invention, an insulation pattern-forming material includes a polysiloxane and an organic solvent. The polysiloxane is obtained by hydrolysis and condensation of a hydrolysable silane compound represented by a general formula (1) and a hydrolysable silane compound represented by a general formula (2). The organic solvent includes a compound represented by a general formula (3). The insulation pattern-forming material is used for a damascene process.

R represents a hydrogen atom, a fluorine atom, a linear or branched alkyl group having 1 to 5 carbon atoms, a cyano group, a cyanoalkyl group, an alkylcarbonyloxy group, an alkenyl group, or an aryl group. X represents a halogen atom or $-OR^1$ wherein $R^1$ represents a monovalent organic group. a is an integer from 1 to 3. In a case where a plurality of R are present, the plurality of R are either identical or different. In a case where a plurality of X are present, the plurality of X are either identical or different.

X is same as defined for the general formula (1).

R' represents a linear or branched alkyl group having 1 to 10 carbon atoms. R" represents a hydrogen atom or a linear or branched alkyl group having 1 to 9 carbon atoms. R' and R" include from 4 to 10 carbon atoms in total.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
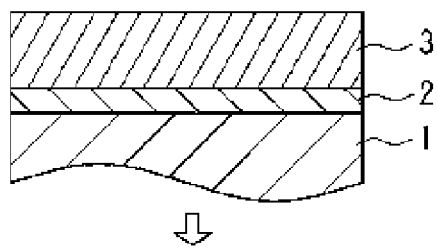
FIG. 1A to FIG. 1F are schematic views illustrating an insulation pattern-forming method according to one embodiment of the invention.
Figure 1B:
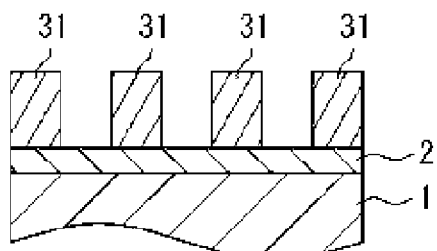
Figure 1C:
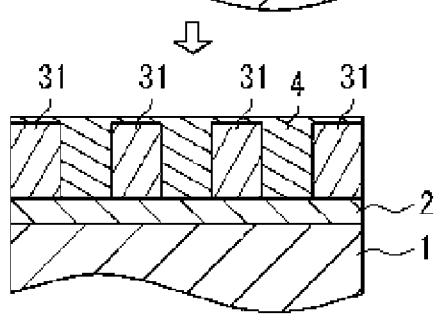

Embodiments of the present invention provide the followings.

[1] An insulation pattern-forming method including:
(I) forming an organic pattern on a substrate (hereinafter may be referred to as "step (I)");
(II) filling a space defined by the organic pattern with an insulating material (hereinafter may be referred to as "step (II)");
(III) removing the organic pattern to obtain an inverted pattern formed of the insulating material (hereinafter may be referred to as "step (III)"); and
(IV) curing the inverted pattern (hereinafter may be referred to as "step (IV)").

[2] The insulation pattern-forming method according to [1], the insulation pattern-forming method including:
(1) forming a first organic pattern (hereinafter may be referred to as "pattern (1)") on the substrate (hereinafter may be referred to as "step (1)");
(2) filling a space defined by the pattern (1) with the insulating material (hereinafter may be referred to as "step (2)");
(3) exposing an upper surface of the pattern (1) (hereinafter may be referred to as "step (3)");
(4) forming a second organic pattern (hereinafter may be referred to as "pattern (2)") that comes in contact with the upper surface of the pattern (1) (hereinafter may be referred to as "step (4)");
(5) filling a space defined by the pattern (2) with the insulating material (hereinafter may be referred to as "step (5)");
(6) removing the pattern (1) and the pattern (2) to obtain an inverted pattern formed of the insulating material (hereinafter may be referred to as "step (6)"); and
(7) curing the inverted pattern (hereinafter may be referred to as "step (7)") (hereinafter may be referred to as "insulation pattern-forming method (2)").

[3] The insulation pattern-forming method according to [1], further including subjecting the organic pattern formed by the step (I) to a solvent insolubilization treatment.

[4] The insulation pattern-forming method according to [3], wherein the solvent insolubilization treatment is a treatment that forms a cured resin film on a surface of the organic pattern.

[5] The insulation pattern-forming method according to [3], wherein the solvent insolubilization treatment is at least one treatment selected from a heat treatment and an exposure treatment on the organic pattern.

[6] The insulation pattern-forming method according to [2], further including subjecting the pattern (1) to a solvent insolubilization treatment.

[7] The insulation pattern-forming method according to [1], wherein the step (II) further includes a drying treatment.

[8] The insulation pattern-forming method according to [2], wherein the step (2) and the step (5) further include a drying treatment.

[9] The insulation pattern-forming method according to [1], wherein the step (I) includes forming the organic pattern by photolithography that utilizes a photoresist material that includes an acid-labile group-containing resin, and the step (III) includes exposing an entire surface of the organic pattern, and removing the organic pattern using a developer.

[10] The insulation pattern-forming method according to [2], wherein the step (1) and the step (4) include forming the organic pattern by photolithography that utilizes a photoresist material that includes an acid-labile group-containing resin, and the step (6) includes exposing an entire surface of the organic pattern, and removing the organic pattern using a developer.

[11] The insulation pattern-forming method according to [1], wherein the step (IV) includes subjecting the inverted pattern to at least one treatment selected from a heat treatment and an exposure treatment.

[12] The insulation pattern-forming method according to [2], wherein the step (7) includes subjecting the inverted pattern to at least one treatment selected from a heat treatment and an exposure treatment.

[13] The insulation pattern-forming method according to [1], wherein the insulating material includes (A) a polysiloxane (hereinafter may be referred to as "polysiloxane (A)") and (B) an organic solvent (hereinafter may be referred to as "organic solvent (B)").

[14] The insulation pattern-forming method according to [13], wherein the polysiloxane (A) is a polysiloxane obtained by hydrolysis and condensation of a hydrolysable silane compound represented by a general formula (1) (hereinafter may be referred to as "compound (1)") and a hydrolysable silane compound represented by a general formula (2) (hereinafter may be referred to as "compound (2)"), $$R_aSiX_{4-a} \quad (1)$$

wherein R represents a hydrogen atom, a fluorine atom, a linear or branched alkyl group having 1 to 5 carbon atoms, a cyano group, a cyanoalkyl group, an alkylcarbonyloxy group, an alkenyl group, or an aryl group, X represents a halogen atom or $—OR^1$, $R^1$ represents a monovalent organic group, and a is an integer from 1 to 3, provided that a plurality of R may be either identical or different when a plurality of R are present, and a plurality of X may be either identical or different when a plurality of X are present, $$SiX_4 \quad (2)$$

wherein X is the same as defined for the general formula (1).

[15] The insulation pattern-forming method according to [13] or [14], wherein the organic solvent (B) includes a compound represented by a general formula (3) (hereinafter may be referred to as "compound (3)"), $$R'—O—R'' \quad (3)$$

wherein R' represents a linear or branched alkyl group having 1 to 10 carbon atoms, and R" represents a hydrogen atom or a linear or branched alkyl group having 1 to 9 carbon atoms, provided that R' and R" include 4 to 10 carbon atoms in total.

[16] The insulation pattern-forming method according to any one of [1] to [15], the insulation pattern-forming method being used for a damascene process.

[17] An insulation pattern-forming material that is used for a damascene process, the insulation pattern-forming material including (A) a polysiloxane obtained by hydrolysis and condensation of a hydrolysable silane compound represented by a general formula (1) (hereinafter may be referred to as "compound (1)") and a hydrolysable silane compound represented by a general formula (2) (hereinafter may be referred to as "compound (2)"), and (B) an organic solvent that includes a compound represented by a general formula (3) (hereinafter may be referred to as "compound (3)"), $$R_aSiX_{4-a} \quad (1)$$

wherein R represents a hydrogen atom, a fluorine atom, a linear or branched alkyl group having 1 to 5 carbon atoms, a cyano group, a cyanoalkyl group, an alkylcarbonyloxy group, an alkenyl group, or an aryl group, X represents a halogen atom or $—OR^1$, $R^1$ represents a monovalent organic group, and a is an integer from 1 to 3, provided that a plurality of R may be either identical or different when a plurality of R are present, and a plurality of X may be either identical or different when a plurality of X are present, $$SiX_4 \quad (2)$$

wherein X is the same as defined for the general formula (1), $$R'—O—R'' \quad (3)$$

wherein R' represents a linear or branched alkyl group having 1 to 10 carbon atoms, and R" represents a hydrogen atom or a linear or branched alkyl group having 1 to 9 carbon atoms, provided that R' and R" include 4 to 10 carbon atoms in total.

[18] The insulation pattern-forming material according to [17], further including (C) a curing accelerator.

[19] The insulation pattern-forming material according to [17], the insulation pattern-forming material being used for the insulation pattern-forming method according to any one of [1] to [15].

It is possible to conveniently form a multilayer structure without requiring a complex etching step and the like by utilizing the insulation pattern-forming method. The insulation pattern-forming material is not intermixed with a resist pattern, exhibits an excellent filling capability, and can form an insulation pattern that exhibits excellent dry etching resistance and excellent insulating properties. The insulation pattern-forming method and the insulation pattern-forming material may suitably used for the damascene process.

The embodiments will now be described with reference to the accompanying drawings, wherein like reference numerals designate corresponding or identical elements throughout the various drawings.

Insulation Pattern-Forming Method

An insulation pattern-forming method according to one embodiment of the invention forms an insulation pattern by performing a step (I) that forms an organic pattern, a step (II) that fills the space defined by the organic pattern with an insulating material, a step (III) that removes the organic pattern, and a step (IV) that cures the resulting inverted pattern. The insulation pattern may suitably be used as an insulating film for forming a damascene interconnect using the damascene process.

An insulation pattern-forming method (2) according to one embodiment of the invention is suitably used for the dual damascene process, and forms the target insulation pattern by repeating the step (I) and the step (II) twice, and then performing the step (III) and the step (IV). More specifically, the insulation pattern-forming method (2) according to one embodiment of the invention includes a step (1) that forms a pattern (1), a step (2) that fills the space defined by the pattern (1) with an insulating material, a step (3) that exposes the upper surface of the pattern (1), a step (4) that forms a pattern (2), a step (5) that fills the space defined by the pattern (2) with the insulating material, a step (6) that removes the organic pattern (patterns (1) and (2)), and a step (7) that cures the resulting inverted pattern. The step (1) and the step (4) correspond to the step (I), the step (2) and the step (5) correspond to the step (II), the step (6) corresponds to the step (III), and the step (7) corresponds to the step (IV).

Step (I)

In the step (I) of the insulation pattern-forming method according to one embodiment of the invention, an organic pattern is formed on a substrate. The organic pattern may be formed by an arbitrary method. The organic pattern may be formed by a known photolithographic process, nanoimprint process, or the like. It is preferable to form the organic pattern using the photolithographic process. The organic pattern may be formed as described below using the photolithographic process, for example.

A resist composition is applied to the substrate, and dried to form a photoresist film. A given area of the resist film is exposed to radiation through a mask having a given pattern. The resist film is then developed to form a given resist pattern (organic pattern). A fine pattern-forming technique such as a double patterning technique or a double exposure technique may be appropriately used when forming the resist pattern. A method that develops a resist composition that includes a resin that increases in solubility in an alkaline developer due to an acid using an organic solvent or the like (see Japanese Patent Application Publication (KOKAI) No. 2008-292975) may also be used either alone or in combination with the double exposure technique.

A silicon wafer, an aluminum-coated wafer, or the like may be used as the substrate. An organic or inorganic antireflective film may be formed on the substrate in advance (see Japanese Examined Patent Publication (KOKOKU) No. 6-12452, for example) in order to maximize the potential of the resist composition.

The resist composition may be prepared by dissolving a chemically-amplified resist composition or the like that includes an acid generator and the like in an appropriate solvent so that the solid content is 0.1 to 20 mass %, and filtering the solution through a filter having a pore size of about 30 nm, for example. A commercially available resist composition (e.g., ArF resist composition or KrF resist composition) may be used directly as the resist composition. The resist composition may be a positive-tone resist composition or a negative-tone resist composition. Note that it is preferable to use a positive-tone resist composition that includes an acid-labile group-containing resin when using a preferable pattern removal method (described later) in the step (III).

The resist composition may be applied by an arbitrary method. Examples of the application method include spin coating, cast coating, roll coating, and the like.

The resist composition may be dried by an arbitrary method. For example, the solvent may be vaporized from the film by preheating. The heating temperature is appropriately adjusted depending on the composition of the resist composition, but is normally about 30° C. to about 200° C., and preferably 50 to 150° C.

The thickness of the resist film obtained by drying is not particularly limited, but is normally 10 to 1000 nm, and preferably 50 to 500 nm.

Radiation used for exposure is appropriately selected from visible rays, ultraviolet rays, deep ultraviolet rays, extreme ultraviolet (EUV) light, X-rays, charged particle rays, and the like depending on the type of acid generator or the like included in the resist composition. It is preferable to use deep ultraviolet rays such as ArF excimer laser light (wavelength: 193 nm) or KrF excimer laser light (wavelength: 248 nm). EUV light may be used to form a fine pattern. Liquid immersion lithography or the like may also suitably be used as the exposure method.

The exposure conditions (e.g., dose) are appropriately selected depending on the composition of the resist composition, the type of additive, and the like.

It is preferable to perform post-exposure bake after exposure. This ensures that the acid-labile group included in the resin component dissociates smoothly. The heating temperature is appropriately selected depending on the composition of the resist composition, but is normally 30 to 200° C., and preferably 50 to 170° C. The heating time is normally 10 to 300 seconds, and preferably 30 to 180 seconds.

An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene) in water is preferably used as the developer used for development. An organic solvent such as an alcohol solvent, a ketone solvent, an ether solvent, an ester solvent, or an amide solvent may also be used.

An appropriate amount of a surfactant or the like may be added to the alkaline aqueous solution (developer).

After development using the alkaline aqueous solution (developer), the resist film is normally rinsed with water, and dried.

The shape of the organic pattern obtained by the step (I) is not particularly limited. The organic pattern may be a line-and-space pattern, a hole pattern, a dot pattern, or the like. The size of the organic pattern (e.g., the line width of a line-and-space pattern, the hole diameter of a hole pattern, or the dot diameter of a dot pattern) may be determined depending on the application. The size of the organic pattern may be 10 to 100 nm, for example.

When the insulation pattern-forming method according to one embodiment of the invention is used for the dual damascene process, it is preferable that the pattern (1) be a dot pattern for forming a via hole (hole) used for connection with a lower-layer interconnect.

It is preferable to subject the organic pattern to a solvent insolubilization treatment. The term "solvent insolubilization treatment" used herein refers to a treatment that provides the organic pattern with improved resistance to an organic solvent that is included in the insulating material with which the space defined by the organic pattern is filled in the step (II). It is particularly preferable to subject the pattern (1) to the solvent insolubilization treatment. Examples of a preferable solvent insolubilization treatment include a treatment that forms a cured resin film on the surface of the organic pattern, a heat treatment, an exposure treatment, and the like.

The cured resin film is not particularly limited as long as the cured resin film does not dissolve or deform the organic pattern, is insoluble in the insulating material, and can be removed together with the organic pattern. Examples of the cured resin film include a film obtained by applying and heating a resin composition that includes an acrylic polymer and a crosslinking agent, a film obtained by applying and irradiating a resin composition that includes an acrylic polymer and a photoinitiator, and the like.

The organic pattern may be subjected to the heat treatment by heating the organic pattern at 50 to 170° C., for example. The organic pattern may be subjected to the exposure treatment by exposing the entire surface of the organic pattern by applying radiation under the above exposure conditions, for example. These treatments may be performed in combination.

Step (II)

In the step (II), the space defined by the organic pattern is filled with the insulating material. More specifically, the insulating material is applied to the substrate (on which the organic pattern is formed) using an appropriate application method (e.g., spin coating, cast coating, or roll coating) to fill the space defined by the organic pattern with the insulating material. The details of the insulating material used in the step (II) are described later.

In the step (II), it is preferable to perform a drying treatment after filling the space defined by the organic pattern with the insulating material.

The drying treatment may be performed by an arbitrary method. For example, the organic solvent included in the insulating material is vaporized by heating the insulating material. The heating temperature is appropriately adjusted depending on the composition of the insulating material, but is normally 80 to 250° C., and preferably 80 to 200° C. When the heating temperature is 80 to 180° C., the upper surface of the pattern (1) can be smoothly exposed (particularly by a wet etchback technique) when using the method for the dual damascene process. The heating time is normally 10 to 300 seconds, and preferably 30 to 180 seconds.

The thickness of the resulting insulating material layer (or the thickness of the dried insulating material layer when performing the drying treatment) is not particularly limited. The thickness of a layer formed by filling the space defined by the pattern (1) with the insulating material (hereinafter may be referred to as "first layer I") and the thickness of a layer formed by filling the space defined by the pattern (2) with the insulating material (hereinafter may be referred to as "second layer II") when using the method for the dual damascene process are normally 10 to 1000 nm, and preferably 50 to 500 nm.

Step (III)

In the step (III), the organic pattern is removed to obtain an inverted pattern formed of the insulating material.

It is preferable to expose the upper surface of the organic pattern before removing the organic pattern. More specifically, the upper surface of the organic pattern is exposed by planarizing the upper surface of the insulating material layer. An etching technique (e.g., dry etchback technique or wet etchback technique), a CMP technique, or the like may be used to planarize the upper surface of the insulating material layer. It is preferable to use a dry etchback technique using fluorine gas or the like, or a CMP technique. Note that the planarization conditions may be appropriately adjusted.

The organic pattern may be removed by an arbitrary method such as wet etching or dry etching. It is preferable to expose the entire surface of the substrate on which the organic pattern is formed, and remove the organic pattern by development (wet etching). When using the above method, the organic pattern is formed by a photolithographic process. Examples of a preferable resist material include a positive-tone resist material that includes an acid-labile group-containing resin and an acid generator. In this case, an acid is generated by the acid generator included in the positive-tone resist material that forms the organic pattern upon exposure, and the acid-labile group included in the resin dissociates and improves the alkali-solubility of the resin, so that the organic pattern can be removed using a developer.

Step (IV)

In the step (IV), the inverted pattern obtained by the step (III) is cured to obtain an insulation pattern. The inverted pattern may be cured by a heat treatment (heat curing treatment) in an inert gas atmosphere or under vacuum, an exposure treatment that preferably utilizes ultraviolet rays (UV curing treatment), or the like. The heating temperature is appropriately adjusted depending on the composition of the insulating material, but is normally 300 to 450° C., and preferably 350 to 420° C. When the heating temperature is 350 to 420° C., the dielectric constant of the material can be effectively decreased. The heating time is normally 10 to 90 minutes, and preferably 10 to 60 minutes. When the insulating material is a siloxane-based material, a low-dielectric-constant film can be effectively obtained by heating the inverted pattern while applying ultraviolet rays (preferably ultraviolet rays emitted from a high-pressure mercury lamp). In this case, the exposure/heating time is normally 1 to 30 minutes, and preferably 1 to 15 minutes.

A specific example of the insulation pattern-forming method according to one embodiment of the invention that includes the steps (I) to (IV) is described below with reference to FIG. 1A to FIG. 1F.

In the step (I), a resist composition is applied to a substrate 1 on which an antireflective film 2 is optionally formed, and dried by heating or the like to form a resist film 3 having a given thickness (see FIG. 1A). A given area of the resist film 3 is exposed to radiation or the like through a mask having a given pattern, and the resist film 3 is developed to form a resist pattern 31 (see FIG. 1B).

In the step (II), an insulating material is applied to the substrate 1 on which the resist pattern 31 is formed so that the space defined by the resist pattern 31 is filled with the insulating material. The insulating material is dried by heating or the like to form an insulating material film 4 (see FIG. 1C).

Figure 1D:
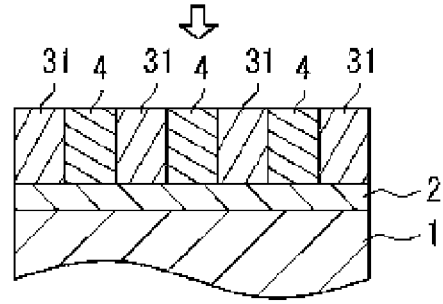
Figure 1E:
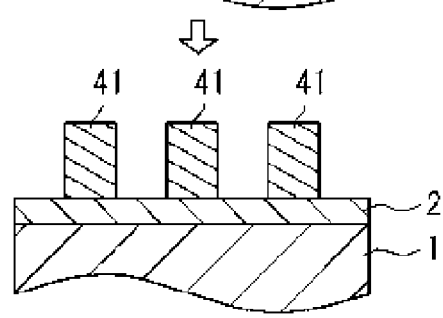

In the step (III), the insulating material film 4 is planarized using an etchback technique, a CMP technique, or the like so that the upper surface of the resist film 31 is exposed (see FIG. 1D). The entire surface of the resist film 31 is then exposed, and removed by development to form an inverted pattern 41 (see FIG. 1E).

Figure 1F:
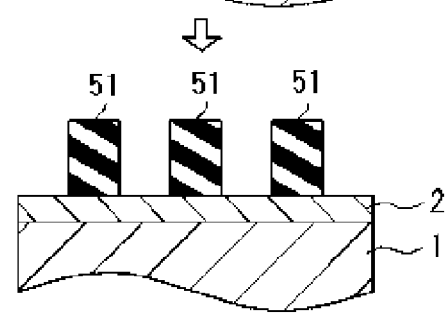

In the step (IV), the inverted pattern 41 is cured by performing the exposure treatment and the heat treatment to form an insulation pattern 51 (see FIG. 1F).

Insulation Pattern-Forming Method (2)

The step (1) is performed in the same manner as the step (1), and the step (2) is performed in the same manner as the step (II). The space defined by the pattern (1) is filled with the insulating material by the steps (I) and (II) to form the first layer I.

In the step (3), the upper surface of the pattern (1) is exposed. More specifically, the upper surface of the first layer I is planarized to expose the upper surface of the pattern (1).

The upper surface of the first layer I may be planarized by the planarization method used to expose the upper surface of the organic pattern. It is preferable to use a dry etchback technique using fluorine-based gas or the like, or a CMP technique.

In the step (4), the pattern (2) that comes in contact with the upper surface of the pattern (1) is formed. More specifically, the pattern (2) is formed on the pattern (1) of which the upper surface has been exposed by the step (3).

The pattern (2) may be formed by an arbitrary method. The pattern (2) may be formed by the method employed in the step (I).

In the step (5), the space defined by the pattern (2) is filled with the insulating material. More specifically, the insulating material is applied to the first layer I (on which the pattern (2) is formed) using an appropriate application method (e.g., spin coating, cast coating, or roll coating) to fill the space defined by the pattern (2) with the insulating material. The insulating material used in the step (II) is suitably used as the insulating material used in the step (5) (the details of the insulating material are described below).

In the step (6), the pattern (1) and the pattern (2) are removed in the same manner as in the step (III) to form an inverted pattern.

In the step (7), the inverted pattern is cured in the same manner as in the step (IV) to form an insulation pattern.

Insulating Material

A material that forms a film having a k-value at room temperature of 5 or less is preferable as the insulating material used for the insulation pattern-forming method according to one embodiment of the invention. The term "k-value" used herein refers to the relative dielectric constant. The k-value is measured as described below. A film is formed on an 8-inch N-type silicon wafer having a resistivity of 0.1 Ω·cm or less using the insulating material, and an aluminum electrode pattern is formed on the film by deposition to obtain a sample. The relative dielectric constant (k-value) of the sample is measured by a CV method at a frequency of 100 kHz using an electrode "HP16451B" and a precision LCR meter "HP4284A" (manufactured by Agilent Technologies).

Examples of a material that meets the above requirement include polysiloxanes (described later); polyarylene ethers such as FLARE (manufactured by Honeywell) (see H. W. Thompson, 1999 Proc. IITC, p. 59 (1999)), PAE-2 (manufactured by Schumacher), SiLK (manufactured by The Dow Chemical Company) (see G. Passemard, Advanced Metallization Conference Proc, p. 357 (1999)), the compounds disclosed in Japanese Patent No. 4324786; cyclobutene polymers such as divinylsiloxanebenzocyclobutene (DVS-BCB) (manufactured by The Dow Chemical Company) (see G. M. Adema, Electronic Packing and Production 32, 72 (1992)), and perfluorocyclobutene (PFCB) (see P. H. Townsend, Mat. Res. Soc. Symp. Proc. 443, 35 (1997)); and polybenzoxazole (e.g., "CRC5200" manufactured by Sumitomo Bakelite Co., Ltd.).

It is preferable to use a polysiloxane (particularly preferably an insulation pattern-forming material according to one embodiment of the invention) as the insulating material.

Insulation Pattern-Forming Material

The insulation pattern-forming material according to one embodiment of the invention includes (A) a polysiloxane and (B) a solvent.

(1) Polysiloxane (A)

The polysiloxane (A) is obtained by hydrolysis and condensation of a compound (1) represented by the general formula (1) and a compound (2) represented by the general formula (2). It is possible to use only one type of the compound (1), or use a plurality of types of the compound (1) in combination, and it is possible to use only one type of the compound (2), or use a plurality of types of the compound (2) in combination.

Examples of the alkyl group having 1 to 5 carbon atoms represented by R in the general formula (1) include linear alkyl groups such as a methyl group, an ethyl group, an n-propyl group, an n-butyl group, and an n-pentyl group, and branched alkyl groups such as an isopropyl group, an isobutyl group, a sec-butyl group, a t-butyl group, and an isoamyl group. Note that one or more hydrogen atoms of these alkyl groups may be substituted with a fluorine atom or the like.

Examples of the cyanoalkyl group include a cyanoethyl group, a cyanopropyl group, and the like.

Examples of the alkylcarbonyloxy group include a methylcarbonyloxy group, an ethylcarbonyloxy group, a propylcarbonyloxy group, a butylcarbonyloxy group, and the like.

Examples of a preferable alkenyl group include groups represented by the following general formula (i).

$$CH_2=CH-(CH_2)_n-*$$ (i)

wherein n is an integer from 0 to 4, and "*" indicates a bonding hand.

n in the general formula (i) is an integer from 0 to 4, preferably 0 or 1, and more preferably 0 (i.e., vinyl group).

Examples of alkenyl groups other than the groups represented by the general formula (i) include a butenyl group, a pentenyl group, a hexenyl group, and the like.

Examples of the aryl group include a phenyl group, a naphthyl group, a methylphenyl group, an ethylphenyl group, a chlorophenyl group, a bromophenyl group, a fluorophenyl group, and the like.

X in the general formulas (1) and (2) represents a halogen atom (e.g., fluorine atom or chlorine atom) or —OR'. Examples of a preferable monovalent organic group represented by $R^1$ include alkyl groups having 1 to 4 carbon atoms, such as a methyl group, an ethyl group, an n-propyl group, an isopropyl group, an n-butyl group, an isobutyl group, a sec-butyl group, and a t-butyl group. a in the general formula (1) is an integer from 1 to 3, and preferably 1 or 2.

Specific examples of the compound (1) represented by the general formula (1) include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, n-propyltriacetoxysilane, n-propyltrichlorosilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltriisopropoxysilane, 2-methylpropyltri-n-butoxysilane, 2-methylpropyl-tri-sec-butoxysilane, 2-methylpropyltri-tert-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltriisopropoxysilane, 1-methylpropyltri-n-butoxysilane, 1-methylpropyltri-sec-butoxysilane, 1-methylpropyltri-tert-butoxysilane, 1-methylpropyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, tert-butyltrichlorosilane, and tert-butyldichlorosilane; alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-tert-butoxysilane, and allyltriphenoxysilane; and the like.

Among these, 4-methylphenyltrimethoxysilane, 4-methoxyphenyltrimethoxysilane, 4-methylbenzyltrimethoxysilane, methyltrimethoxysilane, methyltrimethoxysilane, methyltriethoxysilane, methyltri-n-propoxysilane, methyltriisopropoxysilane, methyltri-n-butoxysilane, methyltri-sec-butoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, vinyltrimethoxysilane, vinyltriethoxysilane, allyltrimethoxysilane, allyltriethoxysilane, and the like are preferable from the viewpoint of reactivity and ease of handling.

Specific examples of the compound (2) represented by the general formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, tetraphenoxysilane, tetrachlorosilane, and the like.

Among these, tetramethoxysilane and tetraethoxysilane are preferable since an inverted pattern that exhibits excellent dry etching resistance can be obtained.

A hydrolysable silane compound represented by the following general formula (ii) (hereinafter may be referred to as "compound (ii)") may optionally be used as the hydrolysable silane compound for obtaining the polysiloxane (A) in addition to the compounds (1) and (2).

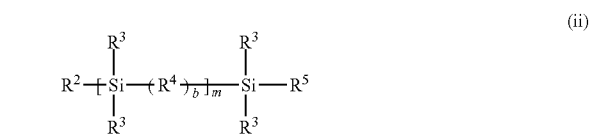

wherein $R^2$ and $R^5$ independently represent a hydrogen atom, a fluorine atom, an alkoxy group, a linear or branched alkyl group having 1 to 5 carbon atoms, a cyano group, a cyanoalkyl group, or an alkylcarbonyloxy group, $R^3$ independently represent a monovalent organic group, $R^4$ represents an arylene group, a methylene group, or an alkylene group having 2 to 10 carbon atoms, provided that a plurality of $R^4$ may be either identical or different when a plurality of $R^4$ are present, b is an integer from 1 to 3, and m is an integer from 1 to 20.

Examples of the alkoxy group represented by $R^2$ and $R^5$ in the general formula (ii) include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like.

Examples of the linear or branched alkyl group having 1 to 5 carbon atoms include a methyl group, an ethyl group, a propyl group, a butyl group, and the like. Note that one or more hydrogen atoms of these alkyl groups may be substituted with a fluorine atom or the like.

Examples of the cyanoalkyl group include a cyanoethyl group, a cyanopropyl group, and the like.

Examples of the alkylcarbonyloxy group include a methylcarbonyloxy group, an ethylcarbonyloxy group, a propylcarbonyloxy group, a butylcarbonyloxy group, and the like.

Examples of the monovalent organic group represented by $R^3$ in the general formula (ii) include an alkyl group, an alkoxy group, an aryl group, an alkenyl group, a group having a cyclic ether structure (e.g., glycidyl group), and the like. Among these, an alkyl group, an alkoxy group, and an aryl group are preferable.

Examples of the alkyl group include linear or branched alkyl groups having 1 to 5 carbon atoms. Specific examples of the alkyl group include a methyl group, an ethyl group, a propyl group, a butyl group, and the like. Note that one or more hydrogen atoms of these alkyl groups may be substituted with a fluorine atom or the like.

Examples of the alkoxy group include linear or branched alkoxy groups having 1 to 10 carbon atoms. Specific examples of the alkoxy group include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like.

Examples of the aryl group include a phenyl group, a naphthyl group, a methylphenyl group, a benzyl group, a phenethyl group, an ethylphenyl group, a chlorophenyl group, a bromophenyl group, a fluorophenyl group, and the like. Among these, a phenyl group is preferable.

Examples of the alkenyl group include a vinyl group, a 1-propenyl group, a 2-propenyl group (allyl group), a 3-butenyl group, a 3-pentenyl group, a 3-hexenyl group, and the like.

When a plurality of $R^4$ are present (i.e., when m is an integer from 2 to 20), the plurality of $R^4$ may be either identical or different.

The arylene group represented by $R^4$ in the general formula (ii) is preferably an arylene group having 6 to 10 carbon atoms, for example. Specific examples of the arylene group include a phenylene group, a naphthylene group, a methylphenylene group, an ethylphenylene group, a chlorophenylene group, a bromophenylene group, a fluorophenylene group, and the like.

Examples of the alkylene group having 2 to 10 carbon atoms include an ethylene group, a propylene group, a butylene group, and the like.

b in the general formula (ii) is an integer from 1 to 3, and preferably 1 or 2.

m is an integer from 1 to 20, preferably an integer from 5 to 15, and more preferably an integer from 5 to 10.

Specific examples of the compound (ii) include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(triethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, bis(dimethylmethoxysilyl)methane, bis(dimethylethoxysilyl)methane, bis(dimethyl-n-propoxysilyl)methane, bis(dimethylisopropoxysilyl)methane, bis(dimethyl-n-butoxysilyl)methane, bis(dimethyl-sec-butoxysilyl)methane, bis(dimethyl-tert-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethylisopropoxysilyl)ethane, 1,2-bis(dimethyl-n-butoxysilyl)ethane, 1,2-bis(dimethyl-sec-butoxysilyl)ethane, 1,2-bis(dimethyl-tert-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(diisopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-tert-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(diisopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-tert-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like.

Further specific examples of the compound (ii) include polycarbosilanes such as polydimethoxymethylcarbosilane and polydiethoxymethylcarbosilane.

Among these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, bis(dimethylmethoxysilyl)methane, bis(dimethylethoxysilyl)methane, 1,2-bis(dimethylmethoxysilyl)ethane, 1,2-bis(dimethylethoxysilyl)ethane, 1-(dimethoxymethylsilyl)-1-(trimethylsilyl)methane, 1-(diethoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, polydimethoxymethylcarbosilane, polydiethoxymethylcarbosilane, and the like are preferable.

These compounds (ii) may be used either alone or in combination.

The insulation pattern-forming material according to one embodiment of the invention may include only one type of the polysiloxane (A), or may include two or more types of the polysiloxane (A).

The polystyrene-reduced weight average molecular weight of the polysiloxane (A) determined by size exclusion chromatography is preferably 2000 to 100,000, more preferably 2000 to 50,000, and particularly preferably 2000 to 30,000.

The molecular weight of the polysiloxane (A) is measured by gel permeation chromatography (GPC) using GPC columns manufactured by Tosoh Corporation (G2000HXL×2, G3000HXL×1, G4000HXL×1) (standard: monodisperse polystyrene, flow rate: 1.0 ml/min, eluant: tetrahydrofuran, column temperature: 40° C.).

(2) Solvent (B)

The solvent (B) is an organic solvent that dissolves the polysiloxane (A), but does not dissolve the organic pattern formed on the substrate. The solvent (B) includes a compound (3).

The compound (3) is an alkyl alcohol having 4 to 10 carbon atoms (i.e., R" in the general formula (3) represents a hydrogen atom) or an alkyl ether (i.e., R" in the general formula (3) represents an alkyl group). R' and R" in the general formula (3) include 4 to 10 (preferably 4 to 8) carbon atoms in total.

Specific examples of the alkyl alcohol as the compound (3) include 1-butanol, 2-butanol, 2-methyl-1-propanol, 2-methyl-2-propanol, 1-pentanol, 2-pentanol, 3-pentanol, 2-ethyl-1-butanol, 2,4-dimethyl-3-pentanol, 4-methyl-2-pentanol, 3-methyl-2-pentanol, and the like. Among these, 1-butanol, 2-butanol, 4-methyl-2-pentanol, 3-methyl-2-pentanol, and 2-methyl-2-propanol are preferable. Specific examples of the alkyl ether as the compound (3) include dipropyl ether, diisopropyl ether, butyl methyl ether, butyl ethyl ether, butyl propyl ether, isoamyl ether, dibutyl ether, diisobutyl ether, tert-butyl-methyl ether, tert-butyl ethyl ether, tert-butyl propyl ether, di-tert-butyl ether, dipentyl ether, isoamyl ether, and the like. Among these, isoamyl ether and dibutyl ether are preferable.

These compounds (3) may be used either alone or in combination.

The solvent (B) may be a mixture of the compound (3) and an additional solvent.

Examples of the additional solvent include monohydric alcohols other than the compound (3), polyhydric alcohols, alkyl ethers of polyhydric alcohols, alkyl ether acetates of polyhydric alcohols, ethers other than the compound (3), cyclic ethers, higher hydrocarbons, aromatic hydrocarbons, ketones, esters, fluorine-based solvents, water, and the like.

Examples of the monohydric alcohols other than the compound (3) include methanol, ethanol, n-propanol, isopropanol, phenol, cyclohexanol, methylcyclohexanol, 3,3,5-trimethylcyclohexanol, benzyl alcohol, phenylmethylcarbinol, diacetone alcohol, cresol, and the like.

Examples of the polyhydric alcohols include ethylene glycol and propylene glycol.

Examples of the alkyl ethers of polyhydric alcohols include ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, propylene glycol monoethyl ether, propylene glycol monopropyl ether, and the like.

Examples of the alkyl ether acetates of polyhydric alcohols include ethylene glycol ethyl ether acetate, diethylene glycol ethyl ether acetate, propylene glycol ethyl ether acetate, propylene glycol monomethyl ether acetate, and the like.

Examples of the ethers other than the compound (3) include dibutyl ether, cyclopentyl methyl ether, cyclohexyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl tert-butyl ether, cyclohexyl butyl ether, cyclohexyl tert-butyl ether, and the like.

Examples of the cyclic ethers include tetrahydrofuran, dioxane, and the like.

Examples of the higher hydrocarbons include decane, dodecane, undecane, and the like.

Examples of the aromatic hydrocarbons include benzene, toluene, xylene, and the like.

Examples of the ketones include acetone, methyl ethyl ketone, methyl isobutyl ketone, cyclohexanone, 4-hydroxy-4-methyl-2-pentanone, diacetone alcohol, and the like.

Examples of the esters include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, and the like.

Examples of the fluorine-based solvent include perfluoroalkanes or perfluorocycloalkanes such as perfluorohexane and perfluoroheptane, perfluoroalkenes that correspond to these perfluoroalkanes or perfluorocycloalkanes, but include a double bond, perfluoro cyclic ethers such as perfluorotetrahydrofuran and perfluoro(2-butyltetrahydrofuran), perfluorotributylamine, perfluorotetrapentylamine, perfluorotetrahexylamine, and the like.

Among these, monohydric alcohols, ethers, cyclic ethers, alkyl ethers of polyhydric alcohols, alkyl ether acetates of polyhydric alcohol, and higher hydrocarbons are preferable.

The insulation pattern-forming material may include water.

The content of the additional solvent in the solvent (B) is preferably 70 mass % or less, and more preferably 60 mass % or less. If the content of the additional solvent exceeds 70 mass %, mixing with the resist may occur.

The insulation pattern-forming material according to one embodiment of the invention may include an additive such as a surfactant or a crosslinking agent in addition to the polysiloxane (A) and the solvent (B).

The insulation pattern-forming material according to one embodiment of the invention may be prepared by an arbitrary method. For example, the hydrolysable silane compounds are subjected to hydrolysis and/or condensation in an organic solvent in the presence of water and a catalyst to obtain the polysiloxane (A). More specifically, the compound (1), the compound (2), and the optional compound (ii) are dissolved in an organic solvent, and subjected to hydrolysis and/or condensation normally at 0 to 100° C. while intermittently or continuously adding water to the solution to obtain the polysiloxane (A). In this case, the catalyst may be dissolved or dispersed in the organic solvent in advance, or may be dissolved or dispersed in water that is added to the solution.

The compound (1) is preferably used in a ratio of 1 to 99 mol %, more preferably 10 to 95 mol %, and particularly preferably 20 to 90 mol %, with respect to the total hydrolysable silane compounds. The compound (2) is preferably used in a ratio of 1 to 99 mol %, more preferably 5 to 90 mol %, and particularly preferably 10 to 80 mol %, with respect to the total hydrolysable silane compounds. When the compounds (1) and (2) are used in the above ratio, it is possible to obtain a composition that facilitates planarization for exposing the surface of the resist film by dry etching using a fluorine-based gas, and exhibits excellent dry etching resistance and excellent storage stability. The compound (ii) is preferably used in a ratio of 0 to 50 mol % with respect to the total hydrolysable silane compounds.

The polysiloxane (A), the solvent (B), and an optional additive are then mixed to prepare the insulation pattern-forming material according to one embodiment of the invention. The content of the polysiloxane (A) may be appropriately adjusted. For example, the content of the polysiloxane (A) may be adjusted to 1 to 30 mass %, and preferably 1 to 20 mass %.

Note that the organic solvent used when synthesizing the polysiloxane (A) is not particularly limited as long as the organic solvent is used for such an application. Examples of the organic solvent include those mentioned above in connection with the solvent (B).

Examples of the catalyst include metal chelate compounds, organic acids, inorganic acids, organic bases, inorganic bases, and the like. Among these, metal chelate compounds, organic acids, and inorganic acids are preferable.

(3) Curing Promoter

The insulation pattern-forming material according to one embodiment of the invention may include a curing promoter in addition to the polysiloxane (A) and the solvent (B). Examples of a preferable curing promoter include an acid generator compound (hereinafter may be referred to as "acid generator") that generates an acid upon application of ultraviolet rays and/or heat, and a base generator compound (hereinafter may be referred to as "base generator") that generates a base upon application of ultraviolet rays. When the insulation pattern-forming material includes the curing promoter, the polysiloxane with which the space defined by the resist pattern is filled proceeds even at a low temperature. Therefore, mild heating conditions can be employed. Specifically, the curing reaction of the polysiloxane is promoted while suppressing thermal deformation of the resist pattern, so that an excellent transferred shape can be maintained.

Examples of the acid generator include a compound that generates an acid upon application of heat (hereinafter may be referred to as "thermal acid generator"), and a compound that generates an acid upon application of ultraviolet rays (hereinafter may be referred to as "photoacid generator").

The thermal acid generator is a compound that normally generates an acid when heated to 50 to 450° C. (preferably 200 to 350° C.). Examples of the thermal acid generator include onium salts such as sulfonium salts, benzothiazolium salts, ammonium salts, and phosphonium salts.

Specific examples of the sulfonium salts include alkylsulfonium salts such as 4-acetophenyldimethylsulfonium hexafluoroantimonate, 4-acetoxyphenyldimethylsulfonium hexafluoroarsenate, dimethyl-4-(benzyloxycarbonyloxy) phenylsulfonium hexafluoroantimonate, dimethyl-4-(benzoyloxy)phenylsulfonium hexafluoroantimonate, dimethyl-4-(benzoyloxy)phenylsulfonium hexafluoroarsenate, and dimethyl-3-chloro-4-acetoxyphenylsulfonium hexafluoroantimonate; benzylsulfonium salts such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroarsenate, benzyl-3-chloro-4-hydroxy-4-hydroxyphenylmethylsulfonium hexafluoroarsenate, 4-methoxybenzyl-4-hydroxyphenylmethylsulfonium hexafluorophosphate, benzoin tosylate, and 2-nitrobenzyl tosylate; dibenzylsulfonium salts such as dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate, and benzyl-4-methoxybenzyl-4-hydroxyphenylsulfonium hexafluorophosphate; substituted benzylsulfonium salts such as p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl-3-methyl-4-hydroxyphenylmethylsulfonium hexafluoroantimonate, 3,5-dichlorobenzyl-4-hydroxyphenylmethylsulfonium hexafluoroantimonate, o-chlorobenzyl-3-chloro-4-hydroxyphenylmethylsulfonium hexafluoroantimonate; and the like.

Specific examples of the benzothiazonium salts include benzylbenzothiazolium salts such as 3-benzylbenzothiazolium hexafluoroantimonate, 3-benzylbenzothiazolium hexafluorophosphate, 3-benzylbenzothiazolium tetrafluoroborate, 3-(p-methoxybenzyl)benzothiazolium hexafluoroantimonate, 3-benzyl-2-methylthiobenzothiazolium hexafluoroantimonate, and 3-benzyl-5-chlorobenzothiazolium hexafluoroantimonate.

Further examples of the thermal acid generator include 2,4,4,6-tetrabromocyclohexadienone.

Among these, 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate, 3-benzylbenzothiazolium hexafluoroantimonate, and the like are preferable. Examples of commercially available products of these compounds include San-Aid SI-L85, San-Aid SI-L110, San-Aid SI-L145, San-Aid SI-L150, San-Aid SI-L160 (manufactured by Sanshin Kagaku Kogyo Co., Ltd.), and the like.

The photoacid generator is a compound that normally generates an acid upon application of ultraviolet rays at a dose of 1 to 100 mJ (preferably 10 to 50 mJ).

Examples of the photoacid generator include onium salt-based photoacid generators such as diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-tert-butylphenyl) iodonium trifluoromethanesulfonate, bis(4-tert-butylphenyl) iodonium dodecylbenzenesulfonate, bis(4-tert-butylphenyl) iodonium naphthalenesulfonate, bis(4-tert-butylphenyl)

iodonium hexafluoroantimonate, bis(4-tert-butylphenyl) iodonium nonafluoro-n-butanesulfonate, triphenylsulfonium trifluoromethanesulfonate, triphenylsulfonium hexafluoroantimonate, triphenylsulfonium naphthalenesulfonate, triphenylsulfonium nonafluoro-n-butanesulfonate, (hydroxyphenyl)benzenemethylsulfonium toluenesulfonate, cyclohexylmethyl(2-oxocyclohexyl)sulfonium trifluoromethanesulfonate, dicyclohexyl(2-oxocyclohexyl)sulfonium trifluoromethanesulfonate, dimethyl(2-oxocyclohexyl) sulfonium trifluoromethanesulfonate, diphenyliodonium hexafluoroantimonate, triphenylsulfonium camphorsulfonate, (4-hydroxyphenyl)benzylmethylsulfonium toluenesulfonate, 1-naphtyldimethylsulfonium trifluoromethanesulfonate, 1-naphtyldiethylsulfonium trifluoromethanesulfonate, 4-cyano-1-naphtyldimethylsulfonium trifluoromethanesulfonate, 4-nitro-1-naphtyldimethylsulfonium trifluoromethanesulfonate, 4-methyl-1-naphtyldimethylsulfonium trifluoromethanesulfonate, 4-cyano-1-naphtyldiethylsulfonium trifluoromethanesulfonate, 4-nitro-1-naphtyldiethylsulfonium trifluoromethanesulfonate, 4-methyl-1-naphtyldiethylsulfonium trifluoromethanesulfonate, 4-hydroxy-1-naphtyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-methoxymethoxy-1-naphthyltetrahydrothiophenium trifluoromethanesulfonate, 4-ethoxymethoxy-1-naphthyltetrahydrothiophenium trifluoromethanesulfonate, 4-(1-methoxyethoxy)-1-naphthyltetrahydrothiophenium trifluoromethanesulfonate, 4-(2-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothiophenium trifluoromethanesulfonate, 4 isopropoxycarbonyloxy-1-naphthyltetrahydrothiophenium trifluoromethanesulfonate, 4-n-buthoxycarbonyloxy-1-naphthyltetrahydrothiophenium trifluoromethanesulfonate, 4-tert-butoxycarbonyloxy-1-naphthyltetrahydrothiophenium trifluoromethanesulfonate, 4-(2-tetrahydrofuranyloxy)-1-naphthyltetrahydrothiophenium trifluoromethanesulfonate, 4-(2-tetrahydropyranyloxy)-1-naphthyltetrahydrothiophenium trifluoromethanesulfonate, 4-benzyloxy-1-naphthyltetrahydrothiophenium trifluoromethanesulfonate, and 1-(naphthylacetomethyl)tetrahydrothiophenium trifluoromethanesulfonate; halogen-containing photoacid generators such as phenylbis (trichloromethyl)-s-triazine, methoxyphenylbis (trichloromethyl)-s-triazine, and naphthylbis (trichloromethyl)-s-triazine;

diazoketone compound-based photoacid generators such as 1,2-naphthoquinonediazide-4-sulfonyl chloride, 1,2-naphthoquinonediazide-5-sulfonyl chloride, and 1,2-naphthoquinonediazide-4-sulfonate or 1,2-naphthoquinonediazide-5-sulfonate of 2,3,4,4'-tetrabenzophenone; sulfonic acid compound-based photoacid generators such as 4-trisphenacylsulfone, mesitylphenacylsulfone, bis(phenylsulfonyl) methane, benzointosylate, tris(trifluoromethanesulfonate) of pyrogallol, nitrobenzyl-9,10-diethoxyanthracene-2-sulfonate, trifluoromethanesulfonylbicyclo[2,2,1]hept-5-ene-2,3-dicarbodiimide, N-hydroxysuccinimide trifluoromethanesulfonate, and 1,8-naphthalenedicarboxylic acid imide trifluoromethanesulfonate; and the like.

These acid generators may be used either alone or in combination.

The acid generator is preferably used in an amount of 0.1 to 10 parts by mass, and more preferably 0.1 to 5 parts by mass, based on 100 parts by mass (solid content) of the polysiloxane (A).

Examples of the base generator include, but are not limited to, triphenylsulfonium compounds, triphenylmethanol, optically active carbamates such as benzyl carbamate and benzoin carbamate, amides such as o-carbamoylhydroxylamide, o-carbamoyloxime, an aromatic sulfonamide, α-lactam, and N-(2-allylethynyl)amide, oxime esters, α-aminoacetophenone, cobalt complexes, and the like.

Among these, a photobase generator (F1) represented by the following general formula (fμ1), and a carbamate-based photobase generator (F2) selected from 2-nitrobenzylcyclohexylcarbamate, [[(2,6-dinitrobenzyl)oxy]carbonyl]cyclohexylamine, N-(2-nitrobenzyloxycarbonyl)pyrrolidine, and bis[[(2-nitrobenzyl)oxy]carbonyl]hexane-1,6-diamine, triphenylmethanol, o-carbamoylhydroxylamide, o-carbamoyloxime, 4-(methylthiobenzoyl)-1-methyl-1-morpholinoethane, (4-morpholinobenzoyl)-1-benzyl-1-dimethylaminopropane, 2-benzyl-2-dimethylamino-1-(4-morpholinophenyl)-butanone, and hexamine cobalt(III) tris (triphenylmethyl borate) are preferable, the photobase generator (F1) and the photobase generator (F2) are more preferable, and the photobase generator (F1) is particularly preferable.

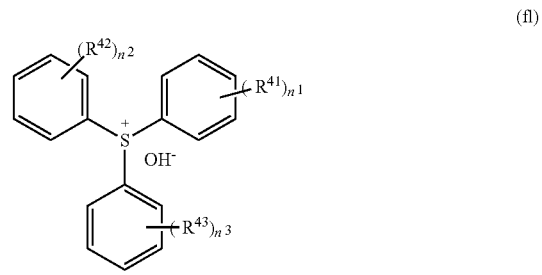

(f1)

wherein $R^{41}$ to $R^{43}$ independently represent an alkyl group, an alkoxy group, or a halogen atom, and $n^1$ to $n^3$ are independently an integer from 0 to 3.

The alkyl group represented by $R^{41}$ to $R^{43}$ in the general formula (f1) is preferably an alkyl group having 1 to 5 carbon atoms, more preferably a linear or branched alkyl group, and particularly preferably a methyl group, an ethyl group, a propyl group, an n-butyl group, or a tert-butyl group.

The alkoxy group represented by $R^{41}$ to $R^{43}$ in the general formula (f1) is preferably an alkoxy group having 1 to 5 carbon atoms, more preferably a linear or branched alkoxy group, and particularly preferably a methoxy group or an ethoxy group.

Examples of the halogen atom include a fluorine atom, a chlorine atom, a bromine atom, an iodine atom, and the like. Among these, a fluorine atom is most preferable.

$n^1$ to $n^3$ in the general formula (f1) are independently an integer from 0 to 3, and preferably 0 or 1. It is most preferable that $n^1$ to $n^3$ be 0.

Specific example of a preferable photobase generator (F1) include the compound represented by the following formula (f1-1).

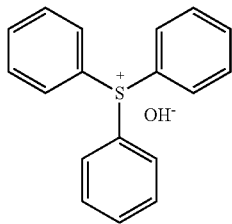

(fl-1)

It is preferable to use 2-nitrobenzylcyclohexylcarbamate as the photobase generator (F2) from the viewpoint of achieving the advantageous effects of the invention.

These acid generators may be used either alone or in combination.

The acid generator is preferably used in an amount of 0.1 to 10 parts by mass, and more preferably 0.1 to 5 parts by mass, based on 100 parts by mass (solid content) of the polysiloxane (A).

EXAMPLES

The invention is further described below by way of examples. Note that the invention is not limited to the following examples. The units "parts" and "%" used in the examples respectively refer to "parts by mass" and "mass %" unless otherwise specified.

The weight average molecular weight (Mw) of the silicon-containing resin obtained in each synthesis example was measured by the following method.

Measurement of Weight Average Molecular Weight (Mw)

The weight average molecular weight (Mw) of the silicon-containing resin was measured by gel permeation chromatography (GPC) using GPC columns manufactured by Tosoh Corporation (G2000HXL×2, G3000HXL×1, G4000HXL×1) (standard: monodisperse polystyrene, flow rate: 1.0 ml/min, eluant: tetrahydrofuran, column temperature: 40° C.).

Synthesis Example 1

Production of Polymer 1

A three-necked quartz flask of which the atmosphere was replaced with nitrogen, was charged with 2.14 g of a 20% maleic acid aqueous solution and 139.6 g of ultrapure water, and the mixture was heated to 65° C. After the dropwise addition of a mixture (solution) of 25.7 g (0.169 mol %) of tetramethoxysilane, 206.7 g (1.52 mol) of methyltrimethoxysilane, and 25.9 g of 3-ethoxy-2-propanol over 1 hour, the mixture was stirred at 65° C. for 4 hours. The reaction solution was returned to room temperature, and concentrated under reduced pressure so that the solid content was 25% to obtain 440 g of a silicon-containing resin solution. The resin contained in the solution is referred to as "silicon-containing resin" (the following formula shows the structural (constituent) units). The Mw of the silicon-containing resin was 8600.

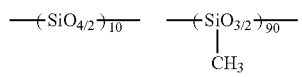

Example 1

Preparation of Insulation Pattern-Forming Material 1

4-Methyl-2-pentanol was added to a polymer 1 obtained in Synthesis Example 1 until the solid content was 4%. The mixture was stirred for 3 hours, and filtered through a filter having a pore size of 0.03 μm to prepare an insulation pattern-forming material 1.

Preparation of Insolubilizing Resin Composition 92 g of p-hydroxyphenylmethacrylanilide, 46 g of t-butoxystyrene, 13 g of hydroxybutyl acrylate, and 12.8 g of azobisisobutyronitrile were dissolved in 600 g of isopropanol. The monomers were polymerized for 6 hours under reflux conditions (82° C.). After cooling the reaction vessel with running water, 150 g of isopropanol (IPA) was added to the reaction vessel. The mixture was added to 4500 g of methanol with stirring to effect reprecipitation, followed by suction filtration. After repeating the reprecipitation operation (addition of IPA to suction filtration) four times, the resulting product was dried at 50° C. under vacuum to obtain 121 g (yield: 81%) of a polymer including the repeating unit represented by the following formula (p-hydroxyphenyl-methacrylanilide/t-butoxystyrene/hydroxybutyl acrylate=58/32/10 (molar ratio)), and having an Mw of 5400 and a dispersity (Mw/Mn) of 1.6.

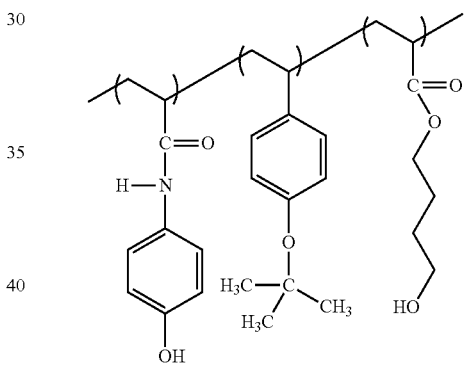

30 parts of a crosslinking agent "Nikalac MX-750" (manufactured by Nippon Carbide Industries Co., Inc.) was added to 100 parts of the resulting polymer, and 1-butanol was added to the mixture so that the solid content was 5%. The mixture was stirred for 3 hours, and filtered through a filter having a pore size of 0.03 nm to prepare an insolubilizing resin composition 1.

Example 2

Formation of Insulation Pattern

A resist composition ("AR230JN" manufactured by JSR Corporation (hereinafter the same)) was applied to an 8-inch silicon wafer, and dried at 126° C. for 90 seconds. The thickness of the resist film was controlled to 150 nm. The substrate on which the resist film was formed was exposed to ArF excimer laser light (wavelength: 193 nm) at a dose of 14 mJ using an ArF excimer laser exposure system (manufactured by Nikon Corporation) via a quartz mask having a dot pattern. The substrate was then heated at 126° C. for 90 seconds. The resist film was developed for 40 seconds using a 2.38% tetramethylammonium hydroxide aqueous solution, rinsed with water, and dried to form a 1:2 dot-and-space pattern (dot diameter: 0.100 µm) (hereinafter may be referred to as "resist pattern 1") on the substrate.

The insulation pattern-forming material 1 was applied to the resist pattern 1 and the space defined by the resist pattern 1 using a spin coater, and heated (baked) at 140° C. for 1 minute on a hot plate to form an insulating material layer 1 having a thickness of 200 nm.

The insulating material layer 1 was developed for 20 seconds using a 2.38% tetramethylammonium hydroxide aqueous solution, rinsed with water, and dried to expose the upper surface of the resist pattern 1.

The substrate was then heated at 160° C. for 90 seconds to dry the insulating material layer 1.

The resist composition was applied to the insulating material layer 1 to a thickness of 150 nm, and dried at 126° C. for 90 seconds. The substrate on which the resist film was formed was exposed to ArF excimer laser light (wavelength: 193 nm) at a dose of 17 mJ using the ArF excimer laser exposure system via a quartz mask having a line pattern. The substrate was then heated at 126° C. for 90 seconds. The resist film was developed for 40 seconds using a 2.38% tetramethylammonium hydroxide aqueous solution, rinsed with water, and dried to form a 1:2 line-and-space pattern (1L2S) (line width: 0.100 µm) (hereinafter may be referred to as "resist pattern 2") on the insulating material layer 1.

The insulation pattern-forming material 1 was applied to the resist pattern 2 and the space defined by the resist pattern 2 using a spin coater, and heated (baked) at 140° C. for 1 minute on a hot plate to form an insulating material layer 2 having a thickness of 200 nm.

The insulating material layer 2 was developed for 20 seconds using a 2.38% tetramethylammonium hydroxide aqueous solution, rinsed with water, and dried to expose the upper surface of the resist pattern 2.

After applying ArF excimer laser light (wavelength: 193 nm) to the entire surface of the substrate at a dose of 34 mJ using the ArF excimer laser exposure system, the substrate was heated at 160° C. for 90 seconds.

The resist pattern 1 and the resist pattern 2 were developed for 60 seconds using a 2.38% tetramethylammonium hydroxide aqueous solution, rinsed with water, and dried to remove the resist composition, and ultraviolet rays were applied to the substrate for 8 minutes using a UV exposure system (manufactured by Axcelis) while heating the substrate at 400° C. on a hot plate inside a chamber having a partial pressure of oxygen of 0.01 kPa to obtain an insulation pattern having a dual damascene structure.

The insulation pattern-forming material 1 was spin-coated onto an 8-inch N-type silicon wafer having a resistivity of 0.1 Ω·cm or less using a coater/developer "CLEAN TRACK ACT 8", and heated at 200° C. for 1 minute on a hot plate, and ultraviolet rays were applied to the silicon wafer for 8 minutes using a UV exposure system while heating the silicon wafer at 400° C. on a hot plate inside a chamber having a partial pressure of oxygen of 0.01 kPa to obtain a cured film. An aluminum electrode pattern was formed on the resulting film by deposition to obtain a relative dielectric constant measurement sample. The relative dielectric constant of the sample was measured by a CV method at a frequency of 100 kHz using an electrode "HP16451B" and a precision LCR meter "HP4284A" (manufactured by Agilent Technologies). The k-value of the sample at room temperature (23° C.) was 2.7, and the k-value of the sample at 200° C. was 2.5.

Example 3

A resist pattern 1 was formed in the same manner as in Example 1. The insolubilizing resin composition was applied to the resist pattern 1 to a thickness of 200 nm using a spin coater, and heated at 140° C. for 1 minute on a hot plate. The insolubilizing resin composition was developed for 60 seconds using a 2.38% tetramethylammonium hydroxide aqueous solution, rinsed with water, and dried to form an insolubilizing film on the surface of the resist pattern 1.

An insulating material layer 1 was formed in the same manner as in Example 1, and the upper surface of the resist pattern 1 was exposed.

The substrate was then heated at 160° C. for 90 seconds to dry the insulating material layer 1.

A resist pattern 2 was formed on the insulating material layer 1 in the same manner as in Example 1.

An insulating material layer 2 was formed in the same manner as in Example 1, and the upper surface of the resist pattern 2 was exposed.

After heating the substrate at 160° C. for 90 seconds, the resist composition was removed using a dry etching system ("UNITY Me" manufactured by Tokyo Electron Ltd.). Next, ultraviolet rays were applied to the substrate for 8 minutes using a UV exposure system (manufactured by Axcelis) while heating the substrate at 400° C. on a hot plate inside a chamber having a partial pressure of oxygen of 0.01 kPa to obtain an insulation pattern having a dual damascene structure.

Example 4

A resist pattern 1 was formed in the same manner as in Example 1. The solvent insolubilization treatment was performed by applying ArF excimer laser light to the resist pattern 1 at a dose of 34 mJ using an ArF excimer laser exposure system, and heating the substrate at 180° C. for 2 minutes.

An insulating material layer 1 was formed in the same manner as in Example 1, and the upper surface of the resist pattern 1 was exposed.

The substrate was then heated at 160° C. for 90 seconds to dry the insulating material layer 1.

A resist pattern 2 was formed on the insulating material layer 1 in the same manner as in Example 1.

An insulating material layer 2 was formed in the same manner as in Example 1, and the upper surface of the resist pattern 2 was exposed.

After applying ArF excimer laser light (wavelength: 193 nm) to the entire surface of the substrate at a dose of 34 mJ using the ArF excimer laser exposure system, the substrate was heated at 160° C. for 90 seconds.

The resist pattern 1 and the resist pattern 2 were developed for 60 seconds using a 2.38% tetramethylammonium hydroxide aqueous solution, rinsed with water, and dried to remove the resist composition, and ultraviolet rays were applied to the substrate for 8 minutes using a UV exposure system (manufactured by Axcelis) while heating the substrate at 400° C. on a hot plate inside a chamber having a partial pressure of oxygen of 0.01 kPa to obtain an insulation pattern having a dual damascene structure.

Obviously, numerous modifications and variations of the present invention are possible in light of the above teachings. It is therefore to be understood that within the scope of the appended claims, the invention may be practiced otherwise than as specifically described herein.

The invention claimed is:
1. An insulation pattern-forming method comprising:
   forming a first organic pattern on a substrate, the first organic pattern comprising: a first acid generator and a first resin which comprises a first acid-labile group;

insolubilizing the first organic pattern to a first organic solvent in a first insulating material by heating, by coating with a cured resin film or by a combination thereof, to provide a first solvent-insolubilized organic pattern, the first insulating material comprising a first polysiloxane and the first organic solvent;

filling a space defined by the first solvent-insolubilized organic pattern with the first insulating material;

exposing an upper surface of the first solvent-insolubilized organic pattern, after the space defined by the first solvent-insolubilized organic pattern is filled;

forming a second organic pattern that comes in contact with the upper surface of the first solvent-insolubilized organic pattern, the second organic pattern comprising: a second acid generator and a second resin which comprises a second acid-labile group;

insolubilizing the second organic pattern to a second organic solvent in a second insulating material by heating, by coating with a cured resin film or by a combination thereof, to provide a second solvent-insolubilized organic pattern, the second insulating material comprising a second polysiloxane and the second organic solvent;

filling a space defined by the second solvent-insolubilized organic pattern with the second insulating material;

exposing an upper surface of the second solvent-insolubilized organic pattern, after the space defined by the second solvent-insolubilized organic pattern is filled;

exposing entire surfaces of the first solvent-insolubilized organic pattern and the second solvent-insolubilized organic pattern to light, such that the first acid-labile group and the second acid-labile group are dissociated by an acid generated by the first acid generator and the second acid generator to solubilize the first solvent-insolubilized organic pattern and the second solvent-insolubilized organic pattern in an alkaline developer and that a first solvent-insolubilized-alkaline-solubilized organic pattern and a second solvent-insolubilized-alkaline-solubilized organic pattern are provided, after the space defined by the second solvent-insolubilized organic pattern is filled;

removing the first solvent-insolubilized-alkaline-solubilized organic pattern and the second solvent-insolubilized-alkaline-solubilized organic pattern using the alkaline developer to obtain an inverted pattern formed of the first insulating material and the second insulating material; and curing the inverted pattern, wherein the first and second acid generators are same or different, the first and second resins are same or different, the first and second acid-labile groups are same or different, the first and second insulating materials are same or different, the first and second polysiloxanes are same or different, and the first and second organic solvents are same or different.

2. The insulation pattern-forming method according to claim 1, wherein the first organic pattern and the second organic pattern are insolubilized by being coated with the cured resin film.

3. The insulation pattern-forming method according to claim 1, wherein the first organic pattern and the second organic pattern are insolubilized by being heated.

4. The insulation pattern-forming method according to claim 1, further comprising:
drying the first insulating material which fills the space defined by the first solvent-insolubilized organic pattern; and
drying the second insulating material which fills the space defined by the second solvent-insolubilized organic pattern.

5. The insulation pattern-forming method according to claim 1, wherein the first organic pattern and the second organic pattern are formed by photolithography.

6. The insulation pattern-forming method according to claim 1, wherein the inverted pattern is cured by being heated, being exposed to light, or both thereof.

7. The insulation pattern-forming method according to claim 1, wherein each of the first polysiloxane and the second polysiloxane is a polysiloxane obtained by hydrolysis and condensation of a hydrolysable silane compound represented by formula (1) and a hydrolysable silane compound represented by formula (2), $$R_a SiX_{4-a} \quad (1)$$

wherein
R represents a hydrogen atom, a fluorine atom, a linear or branched alkyl group having 1 to 5 carbon atoms, a cyano group, a cyanoalkyl group, an alkylcarbonyloxy group, an alkenyl group, or an aryl group,
X represents a halogen atom or $-OR^1$, wherein $R^1$ represents a monovalent organic group, and
a is an integer from 1 to 3, wherein in a case where a plurality of R are present, the plurality of R are either identical or different, and in a case where a plurality of X are present, the plurality of X are either identical or different, $$SiX_4 \quad (2)$$

wherein X is same as defined for the general formula (1).

8. The insulation pattern-forming method according to claim 1, wherein each of the first organic solvent and the second organic solvent includes a compound represented by formula (3), $$R'-O-R'' \quad (3)$$

wherein R' represents a linear or branched alkyl group having 1 to 10 carbon atoms, and R" represents a hydrogen atom or a linear or branched alkyl group having 1 to 9 carbon atoms, wherein R' and R" include from 4 to 10 carbon atoms in total.

9. The insulation pattern-forming method according to claim 1, wherein the insulation pattern-forming method is used for a damascene process.

10. The insulation pattern-forming method according to claim 1, wherein the first organic pattern and the second organic pattern are insolubilized by being heated at 50 to 170° C.

11. The insulation pattern-forming method according to claim 1, wherein the upper surface of the first solvent-insolubilized organic pattern is exposed by planarizing an upper surface of the first insulating material layer.

12. The insulation pattern-forming method according to claim 1, wherein the upper surface of the second solvent-insolubilized organic pattern is exposed by planarizing an upper surface of the second insulating material layer.

* * * * *